(12) United States Patent
Marotta et al.

(10) Patent No.: US 8,610,490 B2
(45) Date of Patent: Dec. 17, 2013

(54) VOLTAGE SWITCHING IN A MEMORY DEVICE

(71) Applicant: Micron Technology, Inc., Boise, ID (US)

(72) Inventors: Giulio G. Marotta, Rieti (IT); Carlo Musilli, Avezzano (IT); Stefano Perugini, Popoli (IT); Alessandro Torsi, Boise, ID (US); Tommaso Vali, Latina (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/849,586

(22) Filed: Mar. 25, 2013

(65) Prior Publication Data

US 2013/0215688 A1   Aug. 22, 2013

Related U.S. Application Data

(63) Continuation of application No. 13/542,250, filed on Jul. 5, 2012, now Pat. No. 8,405,444, which is a continuation of application No. 12/775,131, filed on May 6, 2010, now Pat. No. 8,217,705.

(51) Int. Cl.
    *H03K 17/687*   (2006.01)
(52) U.S. Cl.
    USPC ............ 327/427; 327/108; 327/434; 327/436
(58) Field of Classification Search
    USPC .................... 326/62, 63, 68, 80, 81; 327/333, 327/365–508; 365/189.11
    See application file for complete search history.

(56) References Cited

U.S. PATENT DOCUMENTS

| | | | |
|---|---|---|---|
| 6,477,092 B2 | 11/2002 | Takano | |
| 6,903,595 B2 | 6/2005 | Won | |
| 7,570,088 B1 | 8/2009 | Ku et al. | |
| 7,636,004 B2* | 12/2009 | Nakatsuka et al. | 327/308 |
| 7,737,773 B2* | 6/2010 | Kanamori et al. | 327/589 |
| 2004/0239399 A1 | 12/2004 | Won | |
| 2005/0017789 A1 | 1/2005 | Burgener et al. | |
| 2006/0181328 A1* | 8/2006 | Nakatsuka et al. | 327/404 |
| 2007/0139094 A1* | 6/2007 | Nakatsuka et al. | 327/430 |
| 2008/0084243 A1* | 4/2008 | Kanamori et al. | 327/589 |
| 2008/0150608 A1 | 6/2008 | Schreiter | |
| 2008/0238522 A1* | 10/2008 | Thorp et al. | 327/333 |
| 2009/0212842 A1* | 8/2009 | Illegems et al. | 327/333 |
| 2010/0220541 A1* | 9/2010 | Gebara et al. | 365/226 |
| 2011/0050321 A1 | 3/2011 | Lee | |
| 2011/0128799 A1 | 6/2011 | Sung | |
| 2011/0156796 A1 | 6/2011 | Jang | |

* cited by examiner

*Primary Examiner* — Lincoln Donovan
*Assistant Examiner* — Brandon S Cole
(74) *Attorney, Agent, or Firm* — Leffert Jay & Polglaze, P.A.

(57) ABSTRACT

Voltage switches, memory devices, memory systems, and methods for switching are disclosed. One such voltage switch uses a pair of switch circuits coupled in series, each switch circuit being driven by a level shift circuit. Each switch circuit uses a group of series coupled transistors with a parallel control transistor where the number of transistors in each group may be determined by an expected switch input voltage and a maximum allowable voltage drop for each transistor. A voltage of a particular state of an enable signal is shifted up to the switch input voltage by the level shift circuits. The particular state of the enable signal turns on the voltage switch such that the switch output voltage is substantially equal to the switch input voltage.

21 Claims, 4 Drawing Sheets

VOLTAGE SWITCHING IN A MEMORY DEVICE

RELATED APPLICATIONS

This is a continuation of U.S. application Ser. No. 13/542,250, titled "VOLTAGE SWITCHING IN A MEMORY DEVICE" filed Jul. 5, 2012 (allowed), which is a continuation of U.S. application Ser. No. 12/775,131 of the same title, filed May 6, 2010 and issued as U.S. Pat. No. 8,217,705 on Jul. 10, 2012, both applications commonly assigned and incorporated entirely herein by reference.

TECHNICAL FIELD

The present embodiments relate generally to memory and a particular embodiment relates to voltage switching in a memory device.

BACKGROUND

Flash memory devices have developed into a popular source of non-volatile memory for a wide range of applications. Flash memory devices typically use a one-transistor memory cell that allows for high memory densities, high reliability, and low power consumption. Common uses for flash memory include personal computers, flash drives, digital cameras, and cellular telephones. Program code and system data such as a basic input/output system (BIOS) are typically stored in flash memory devices for use in personal computer systems.

A flash memory is a type of non-volatile memory that can be erased and reprogrammed in blocks instead of one byte at a time. A typical flash memory comprises a memory array that includes a large number of memory cells. Changes in threshold voltage of the memory cells, through programming of charge storage structures (e.g., floating gates or charge traps) or other physical phenomena (e.g., phase change or polarization), determine the data value of each cell. The cells are typically grouped into blocks. Each of the cells within a block can be electrically programmed, such as by charging the charge storage structure. The data in a cell of this type is determined by the presence or absence of the charge in the charge storage structure. The charge can be removed from the charge storage structure by an erase operation.

Certain memory operations in a non-volatile memory device use high voltages (e.g., greater than a device supply voltage) on the control gates of the memory cells. For example, programming memory cells might use voltages in the range of 15V-20V. These voltages need to be switched from the high voltage sources (e.g., charge pumps) to the various circuits of the memory device that need the high voltages.

Two circuit architectures are typically used to perform the high voltage switching in non-volatile memory devices: local pump high voltage switches (LPHVSW) and self-boosting high voltage switches (SBHVSW). Both of these architectures have their respective drawbacks.

An LPHVSW architecture, illustrated in FIG. 1, uses a local boosting charge pump 100 to generate the control voltage of a high voltage MOS pass transistor 101. In this architecture, $SW_{out}=SW_{in}-V_{thSHV}$ when $V_g$ is boosted to $SW_{in}$, where $SW_{out}$ and $SW_{in}$ are the output and input voltages respectively, and $V_{thSHV}$ is the threshold voltage of the MOS transistor 101. In order to obtain $SW_{out}=SW_{in}$, a $V_g$ that is greater than $SW_{in}$ is used.

This circuit generally drives large, critical parasitic elements that are sensitive to layout configurations, high voltages applied to some circuit nodes, and a clock generator with a switching speed that is dependent on a clock frequency. These drawbacks of the LPHVSW architecture can limit the performance of high voltage multiplexers, such as the global word line driver of a memory array.

An SBHVSW architecture, illustrated in FIG. 2, uses a combination of a high voltage depletion-mode NMOS transistor 200, with a threshold voltage that is less than 0V, and a high voltage PMOS transistor 201. In the illustrated circuit, when enb=0V, then $SW_{out}=SW_{in}$. Thus, this circuit provides reduced operational voltages compared to the circuit of FIG. 1. However, the circuit of FIG. 2 lacks bi-directionality and experiences a reverse leakage of current when used in an SBHVSW voltage multiplexer.

For the reasons stated above, and for other reasons stated below that will become apparent to those skilled in the art upon reading and understanding the present specification, there is a need in the art for a voltage switch with improved performance.

DETAILED DESCRIPTION

Figure 1:
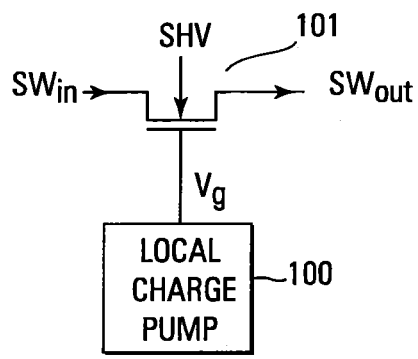
FIG. 1 shows a schematic diagram of a typical prior art local pump high voltage switch circuit.
Figure 2:
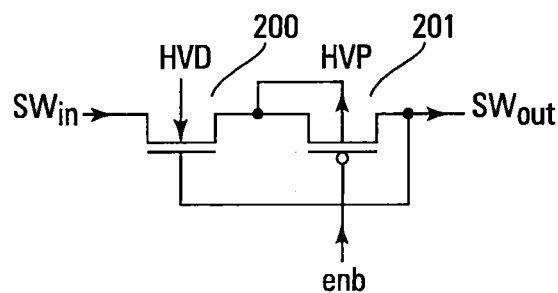
FIG. 2 shows a schematic diagram of a typical prior art self-boosting high voltage switch circuit.

In the following detailed description, reference is made to the accompanying drawings that form a part hereof and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

Figure 3:
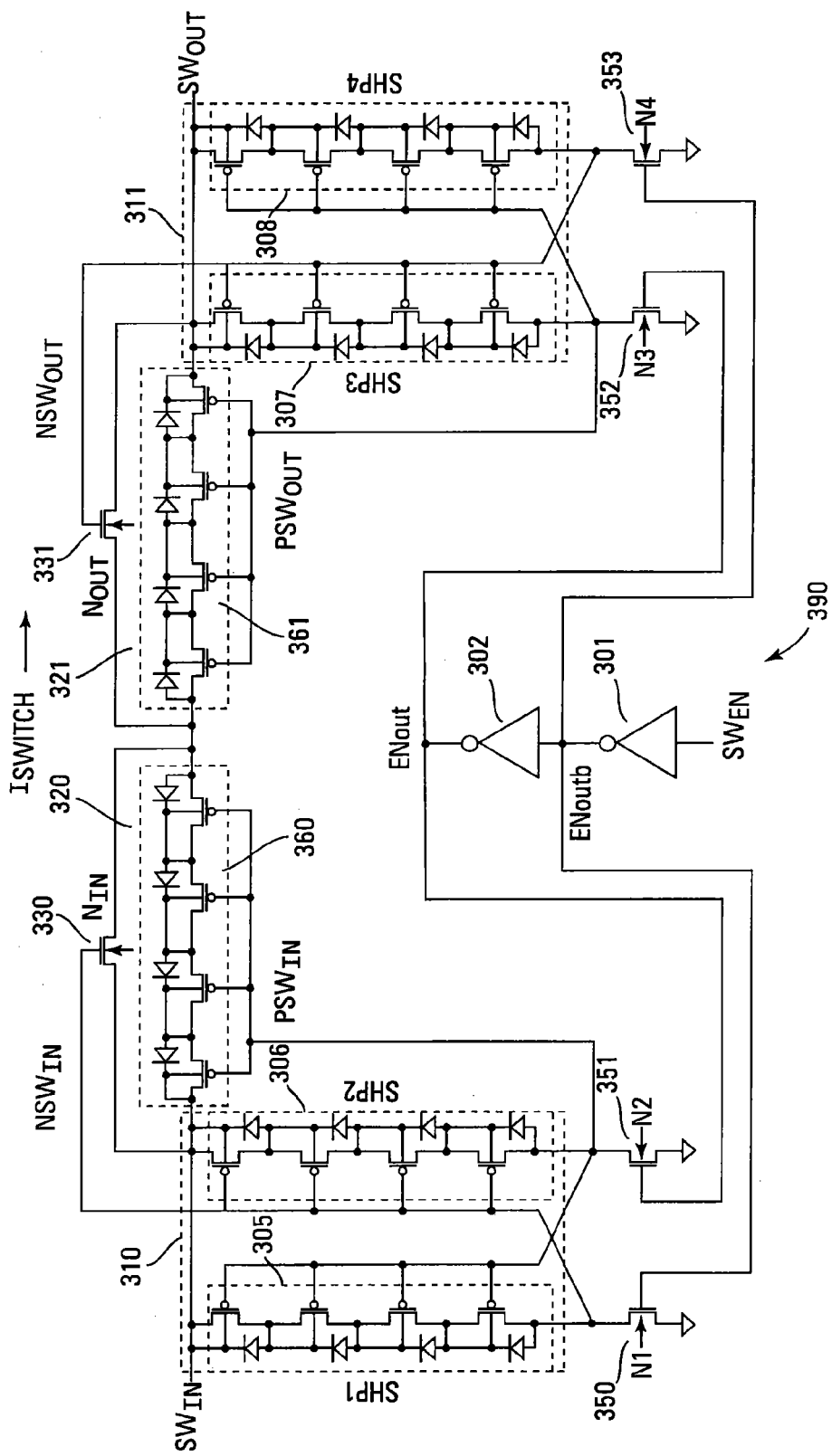
FIG. 3 shows a schematic diagram of one embodiment of a high voltage switch circuit.

FIG. 3 illustrates a schematic diagram of one embodiment of a high voltage switch circuit based on level shift circuits. The illustrated embodiment is comprised of two switch circuits 320, 321 coupled in series. These circuits provide the switching of the $SW_{IN}$ voltage to the $SW_{OUT}$ output. A first level shift circuit 310 is coupled to an input of a first switch circuit 320. A second level shift circuit 311 is coupled to an output of a second switch circuit 321. An enable signal circuit 390 is coupled to the level shift circuits 310, 311 to provide the different states (e.g., a logical high component and a logical low component) of the enable signal to the various circuit components.

The level shift circuits 310, 311 drive the gates of the transistors of their respective switch circuits 320, 321. For example, the first level shift circuit 310 (e.g., input level shift circuit) generates the $NSW_{IN}$ and the $PSW_{IN}$ signals. The $NSW_{IN}$ signal drives the n-channel transistor $N_{IN}$ 330 and the $PSW_{IN}$ signal drives the control gates of the p-channel transistors 360 of the first switch circuit 320 (e.g., input switch circuit). The second level shift circuit 311 (e.g., output level shift circuit) generates the NSW$_{OUT}$ and the PSW$_{OUT}$ signals. The NSW$_{OUT}$ signal drives the n-channel transistor N$_{OUT}$ 331 and the PSW$_{OUT}$ signal drives the control gates of the p-channel transistors 361 of the second switch circuit 321 (e.g., output switch circuit).

The level shift circuits 310, 311 have the relatively low voltage (e.g., 3V) signal inputs of ENOUT and ENOUTb and output the relatively high voltage (e.g., 20V) of SW$_{IN}$ and SW$_{OUT}$. Each level shift circuit 310, 311 includes two groups of series connected p-channel transistors 305-308. The input level shift circuit 310 includes SHP1 305 and SHP2 306 while the output level shift circuit 311 includes SHP3 307 and SHP4 308.

Each switch circuit 320, 321 and each level shift circuit 310, 311 are shown with four series coupled p-channel transistors in each circuit. This is only one possible embodiment for these circuits. Since each circuit has to drop a relatively large voltage (e.g., 20V) across the circuit, the greater the quantity of transistors in each circuit, the lower the maximum drain-to-source voltage (V$_{DS}$) experienced by each transistor.

The illustrated embodiment assumes a 20V input voltage that is to be switched. Thus, with four transistors in each circuit 310, 311, 320, 321, each transistor is expected to experience a maximum V$_{DS}$ of 5V. Fewer transistors can be used in each circuit 310, 311, 320, 321 assuming the transistor can withstand a larger V$_{DS}$. In the alternative, a greater number of transistors may be used in each circuit 310, 311, 320, 321 in order to use transistors having a lower maximum V$_{DS}$. Typically, these types of p-channel transistors can be less expensive to manufacture since they require no additional processing for high voltage source/drain diffusions.

The substantially identical switch circuits 320, 321 and the substantially identical level shift circuits 310, 311 provide the bi-directionality to the high voltage switch circuit. Because of the inherent diodes of each circuit 310, 311, 320, 321 between series connections of transistor pairs, the second switch circuit 321 and the second level shift circuit 311 provide current flow in the opposite direction from the first switch circuit 320 and the first level shift circuit 310. At least one set of diodes of the circuits 310, 311, 320, 321 will thus be forward biased in one of two possible polarity situations (e.g., SW$_{IN}$>SW$_{OUT}$ or SW$_{IN}$<SW$_{OUT}$). Additionally, when the switch circuit is turned off, a blocking series of diodes are reverse biased to provide leakage protection regardless of the voltage polarity between SW$_{IN}$ and SW$_{OUT}$.

The control signal SW$_{EN}$ that turns the switch on and off can be provided by control logic. In one embodiment, SW$_{EN}$ is at a logic high at 3V and a logic low at 0V.

Two modes of operation of the high voltage switch circuit are described subsequently. In the first mode, the switch is turned on and the voltage at SW$_{IN}$ is passed on to SW$_{OUT}$. SW$_{OUT}$ may start at 0V and eventually rise to approximately SW$_{IN}$ (within inherent losses of the activated transistors) if the load is capacitive. In the second mode, the switch is turned off and the voltage at SW$_{IN}$ is not passed on to SW$_{OUT}$. In this mode, SW$_{OUT}$ remains substantially at 0V. An SW$_{IN}$ of 20V is used subsequently in describing the operation of the high voltage switch circuit. This voltage is for purposes of illustration only as any voltage can be used.

The subsequent discussion assumes that SW$_{IN}$>SW$_{OUT}$. However, the bi-directional nature of the switch allows the opposite to also be true.

Referring to FIG. 3, the switch is turned on by the control logic setting SW$_{EN}$ to a logic high. This signal is applied to the first inverter 301 that generates the ENOUTb control signal at a logic low and the second inverter 302 that generates ENOUT at a logic high.

The logic low ENOUTb signal is applied to control transistors N1 350 and N4 353. The logic low ENOUTb turns these transistors 350, 353 off. Thus, the SHP1 series of transistors 305 and the SHP4 series of transistors 308 are turned on so that NSW$_{OUT}$=SW$_{OUT}$ and NSW$_{IN}$=SW$_{IN}$=20V, which turns on n-channel transistors N$_{IN}$ 330 and N$_{OUT}$ 331.

The logic high ENOUT signal is applied to control transistors N2 351 and N3 352. The logic high ENOUT turns these transistors 351, 352 on. Thus, the SHP2 series of transistors 306 and the SHP3 series of transistors 307 are turned off so that PSW$_{IN}$=0V and PSW$_{OUT}$=0V. PSW$_{IN}$ and PSW$_{OUT}$ being at 0V turns on the switch circuits 320, 321 respectively. Current I$_{SWITCH}$ flows from SW$_{IN}$ to SW$_{OUT}$ and the diodes associated with the transistors of the first switch circuit 320 are reverse biased. The diodes associated with the transistors of the second switch circuit 321 are forward biased but do not conduct provided that I$_{SWITCH}$×RdsON<V$_{be}$ where RdsON is the on resistance of each of the series coupled transistors of the second switch circuit 321.

The switch is turned off by the control logic setting SW$_{EN}$ to a logic low. In this mode, the input voltage is not switched to the output so that, in the illustrated embodiment, SW$_{IN}$=20V and SW$_{OUT}$=0V.

A logic low SW$_{EN}$ signal results in a logic high ENOUTb signal from the first inverter 301 and a logic low ENOUT signal from the second inverter 302. The logic high ENOUTb signal turns on control transistors N1 350 and N4 353. Thus, the SHP1 305 and SHP4 308 series transistors are turned off so that PSW$_{IN}$=SW$_{IN}$=20V and PSW$_{OUT}$=SW$_{OUT}$. Since control transistors N1 350 and N4 353 are turned on, both NSW$_{IN}$ and NSW$_{OUT}$ are at 0V so that transistors N$_{IN}$ 330 and N$_{OUT}$ 331 are turned off, the switch circuits 320, 321 are turned off, and current I$_{SWITCH}$ is not flowing.

The diodes associated with the transistors of the first switch circuit 320 are reverse biased. The diodes associated with the transistors of the second switch circuit 321 are forward biased. In this condition, the voltage difference SW$_{IN}$−SW$_{OUT}$=20V−0V=20V is almost entirely dropped across only the transistors of the first switch circuit 320. These transistors of the first switch circuit 320 should therefore have a maximum V$_{DS}$ capability greater than SW$_{IN}$/(transistor quantity) in order to stop a breakdown that would cause a current flow through the switch.

The quantity of transistors that can be used in each of the switch circuits 320, 321 and level shift circuits 310, 311 can be determined by maximum voltage drop (V$_{max}$) across all of the transistors of each circuit 310, 311, 320, 321 divided by the maximum voltage that each transistor in each circuit can withstand (V$_{dsmax}$). In other words, V$_{max}$/V$_{dsmax}$. Therefore, the greater the quantity of transistors in each circuit, the lower the voltage drop across each transistor of each circuit. In the illustrated embodiment, the maximum voltage that the switch is to handle is SW$_{IN}$=20V. If it is assumed that each transistor can withstand 5V prior to breakdown, the quantity of series coupled transistors in each circuit 310, 311, 320, 321 may be four or more. The embodiment of FIG. 3 shows each circuit 310, 311, 320, 321 having the same number of transistors. However, alternate embodiments that use different SW$_{IN}$ voltages and/or different transistors having a different V$_{ds}$ may use different quantities in each switch and level shift circuit.

Figure 4:
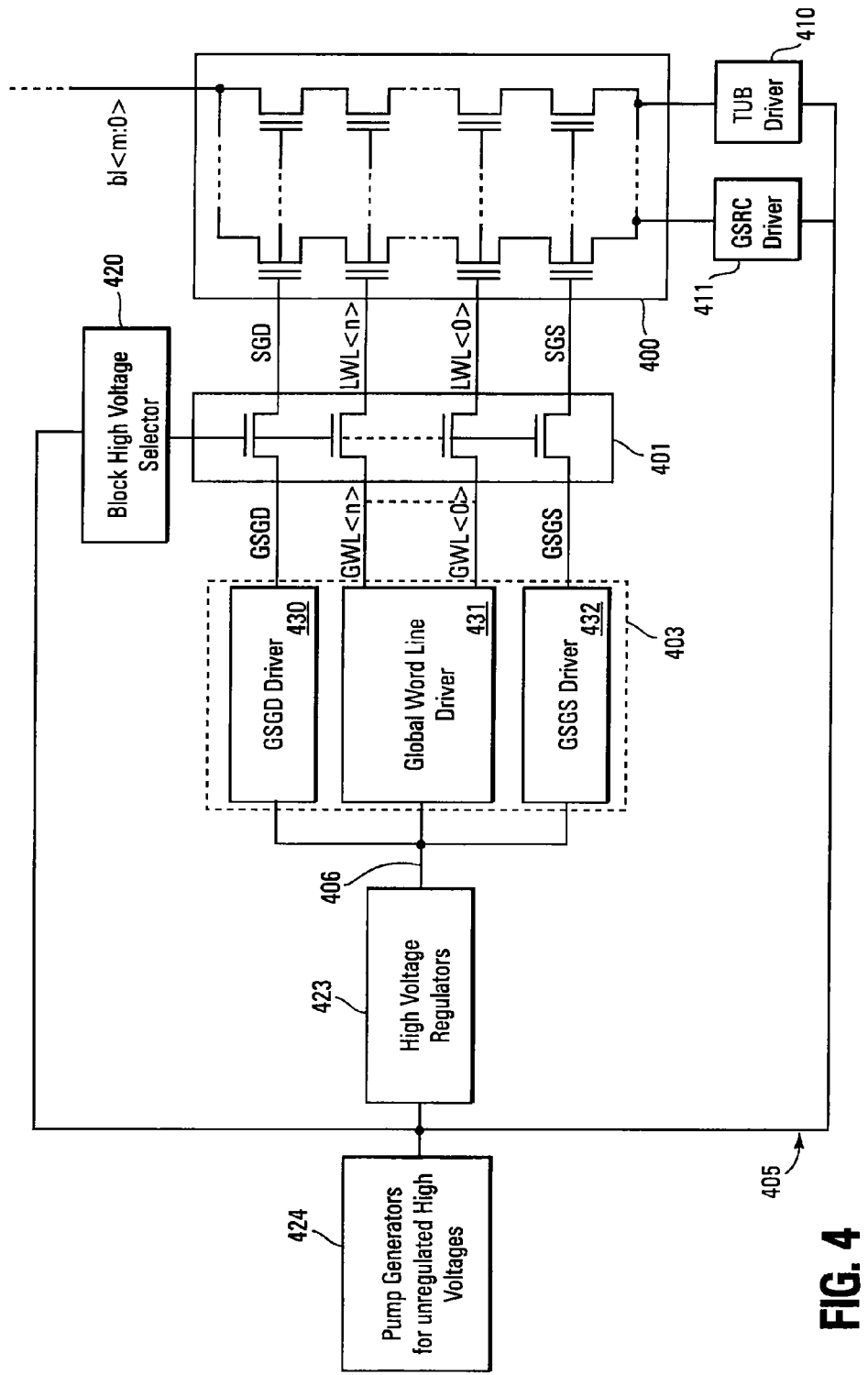
FIG. 4 shows a block diagram of one embodiment of a portion of a memory device configured to incorporate the high voltage switch circuit of the embodiment of FIG. 3.

FIG. 4 illustrates a block diagram of one embodiment of a portion of a memory device incorporating the high voltage switch circuit of the embodiment of FIG. 3. In one embodiment, the memory device includes a non-volatile memory array 400 such as flash memory.

In one embodiment, the memory array 400 is comprised of a NAND architecture array of floating gate memory cells. Alternate embodiments can use other types of memory architecture including NOR and AND. The memory array 400 is comprised of a plurality of access lines (e.g., local word lines) LWL<n:0> and data lines (e.g., bit lines) BL<m:0>. Each end of the series string of memory cells of the array 400 includes a select gate transistor. One end of the series string has a select gate drain transistor that is controlled by the select gate drain (SGD) line. The other end of the series string has a select gate source transistor that is controlled by the select gate source (SGS) line.

The SGD, SGS, and LWL<n:0> lines are driven by a string driver block 401 that drives the voltages for these signals. A memory block high voltage selector 420 controls the switching of high voltages to the string driver 401. The memory block high voltage selector 420 can incorporate a plurality of the high voltage switch circuits of the present disclosure.

An array driver 403 can also be comprised of a plurality of the high voltage switch circuits of the present disclosure. This array driver 403 is responsible for switching high voltages to the select gate drain, select gate source, and word lines of the memory array. The array driver 403 incorporates a global select gate drain driver 430, a global word line driver 431, and a global select gate source driver 432. The global select gate drain driver 430 drives all of the select gate drain lines of the memory array 400. The global select gate source driver 432 drives all of the select gate source lines of the memory array 400. The global word line driver 431 drives all of the global word lines of the memory array 400.

A global source line (GSRC) driver 411 controls the voltages applied to the source line of the memory array 400. A tub driver 410 controls the voltages applied to the semiconductor tub in which the memory array 400 is located.

High voltage regulators 423 regulate the unregulated high voltage from the charge pump generators 424. The regulated voltages from the regulators 423 are input over a high voltage bus 406 to the array driver 403 to be switched by the plurality of high voltage switch circuits of the present disclosure. The unregulated charge pump generator 424 voltages are also transferred, over a high voltage bus 405, to the high voltage switch circuits of the memory block high voltage selector 420 and to the global source line driver 411 and tub driver 410.

Figure 5:
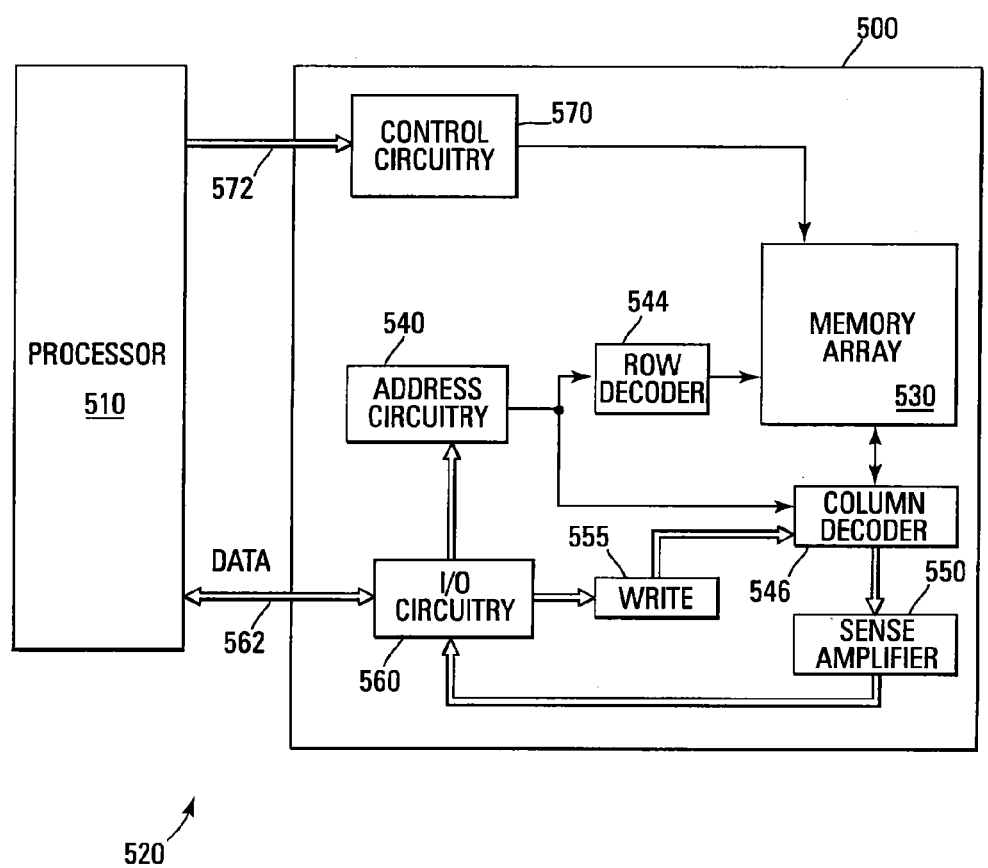
FIG. 5 shows a block diagram of one embodiment of a memory system configured to incorporate the high voltage switch circuit of the embodiment of FIG. 3.

FIG. 5 illustrates a functional block diagram of a memory device 500 that can incorporate the embodiment of FIG. 4. The memory device 500 is coupled to an external processor 510. The processor 510 may be a microprocessor or some other type of controller. The memory device 500 and the processor 510 form part of a memory system 520.

The memory device 500 includes an array 530 of non-volatile memory cells. The memory array 530 is arranged in banks of word line rows and bit line columns. In one embodiment, the columns of the memory array 530 are comprised of series strings of memory cells. As is well known in the art, the connections of the cells to the bit lines determines whether the array is a NAND architecture, an AND architecture, a NOR architecture, or some other type of architecture.

Address buffer circuitry 540 is provided to latch address signals provided through I/O circuitry 560. Address signals are received and decoded by a row decoder 544 and a column decoder 546 to access the memory array 530. It will be appreciated by those skilled in the art, with the benefit of the present description, that the number of address input connections depends on the density and architecture of the memory array 530. That is, the number of addresses increases with both increased memory cell counts and increased bank and block counts.

The memory device 500 reads data in the memory array 530 by sensing voltage or current changes in the memory array columns using sense amplifier circuitry 550. The sense amplifier circuitry 550, in one embodiment, is coupled to read and latch a row of data from the memory array 530. Data input and output buffer circuitry 560 is included for bidirectional data communication as well as the address communication over a plurality of data connections 562 with the controller 510. Write circuitry 555 is provided to write data to the memory array.

Memory control circuitry 570 decodes signals provided on control connections 572 from the processor 510. These signals are used to control the operations on the memory array 530, including data read, data write (program), and erase operations. The memory control circuitry 570 may be a state machine, a sequencer, or some other type of controller to generate the memory control signals. In one embodiment, the memory control circuitry 570 is configured to execute methods for switching high voltages in the memory device by controlling the high voltage switch circuit discussed previously.

The flash memory device illustrated in FIG. 5 has been simplified to facilitate a basic understanding of the features of the memory. A more detailed understanding of internal circuitry and functions of flash memories are known to those skilled in the art.

CONCLUSION

In summary, one or more embodiments of the high voltage switch circuit switch voltages greater than a supply voltage from charge pumps to the memory array of a memory device. Two switch circuits, each comprised of groups of series coupled transistors, are coupled in series to provide bidirectional operation while the inherent diodes from the series connections provide blockage of leakage current when the switch is off. An input level shift circuit coupled to the input switch circuit and an output level shift circuit coupled to the output switch circuit drive their respective switch circuits by shifting a relatively low voltage control signal to a relatively high voltage output signal.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A memory device comprising:
a memory array comprising a plurality of memory cells; and
a voltage switch coupled to the memory array and comprising:
a first switch circuit comprising a control transistor in parallel with a plurality of series coupled transistors and having a switch input;
a second switch circuit comprising a control transistor in parallel with a plurality of series coupled transistors, the second switch circuit coupled in series to the first switch circuit and having a switch output;

a first level shift circuit, coupled to the switch input, configured to drive the control transistor and the plurality of series coupled transistors of the first switch circuit in response to an enable signal;

a second level shift circuit, coupled to the switch output, configured to drive the control transistor and the plurality of series coupled transistors of the second switch circuit in response to the enable signal.

2. The memory device of claim 1, further comprising an enable circuit comprising a plurality of inverter gates, a first inverter gate configured to generate an inverse logical state of the enable signal and a second inverter gate configured to generate the logical state of the enable signal from the inverse logical state.

3. The memory device of claim 2,
wherein the first level shift circuit comprises:
a first group of transistors coupled in series;
a second group of transistors coupled in series;
a first control transistor coupled in series with the first group of transistors and to control gates of the second group of transistors; and
a second control transistor coupled in series with the second group of transistors and to control gates of the first group of transistors; and
wherein the second level shift circuit comprises:
a third group of transistors coupled in series;
a fourth group of transistors coupled in series;
a third control transistor coupled in series with the third group of transistors and to control gates of the fourth group of transistors; and
a fourth control transistor coupled in series with the fourth group of transistors and to control gates of the third group of transistors.

4. The memory device of claim 3, wherein the first and third control transistors are enabled by the logical state of the enable signal and the second and fourth control transistors are enabled by the inverse logical state of the enable signal.

5. The memory device of claim 3, wherein the first control transistor is further coupled to control gates of the plurality of series coupled transistors of the first switch circuit and the third control transistor is further coupled to control gates of the plurality of series coupled transistors of the second switch circuit.

6. The memory device of claim 3, wherein the second control transistor is further coupled to a control gate of the control transistor of the first switch circuit and the fourth control transistor is further coupled to a control gate of the control transistor of the second switch circuit.

7. The memory device of claim 1, wherein each transistor of the plurality of series coupled transistors of the first and second switch circuits is coupled to an associated diode.

8. The memory device of claim 1, wherein an input voltage coupled to the switch input is switched to the switch output in response to the enable signal.

9. The memory device of claim 1, wherein control transistors of the first and second switch circuits are n-channel transistors and the series coupled transistors of the first and second switch circuits are p-channel transistors.

10. The memory device of claim 1, wherein the second switch circuit and the second level shift circuit are configured provide current flow in an opposite direction from the first switch circuit and the first level shift circuit.

11. A memory device, comprising:
a memory array comprising a plurality of memory cells; and
a voltage switch coupled to the memory array, the voltage switch comprising:
a pair of switch circuits coupled in series, each switch circuit comprising a group of series coupled transistors in parallel with a control transistor;
an input level shift circuit coupled to a switch input wherein, in response to an enable signal, a first group of series coupled transistors of the input level shift circuit is configured to drive the control transistor of a first switch circuit and a second group of series coupled transistors of the input level shift circuit is configured to drive control gates of the group of series coupled transistors of the first switch circuit; and
an output level shift circuit coupled to a switch output wherein, in response to the enable signal, a first group of series coupled transistors of the output level shift circuit is configured to drive the control transistor of a second switch circuit and a second group of series coupled transistors of the output level shift circuit is configured to drive control gates of the group of series coupled transistors of the second switch circuit.

12. The memory device of claim 11, wherein each group of series coupled transistors of the first and second switch circuits includes inherent diodes that provide blockage of leakage current when the voltage switch is off.

13. The memory device of claim 11, wherein a certain state of the enable signal causes the output voltage to be less than the input voltage.

14. The memory device of claim 11, wherein a certain state of the enable signal turns on the first group of series coupled transistors of the input and output level shift circuits and turns off the second group of series coupled transistors of the input and output level shift circuits.

15. The memory device of claim 14, wherein a certain other state of the enable signal turns off the first group of series coupled transistors of the input and output level shift circuits and turns on the second group of series coupled transistors of the input and output level shift circuits.

16. The memory device of claim 11, wherein a certain state of the enable signal reverse biases diodes associated with the group of series coupled transistors of the first switch circuit and forward biases diodes associated with the group of series coupled transistors of the second switch circuit.

17. The memory device of claim 11, wherein a certain state of the enable signal causes an output voltage of the voltage switch to substantially equal an input voltage of the voltage switch.

18. A memory device comprising:
a memory array comprising a plurality of memory cells; and
a voltage switch coupled to the memory array and comprising:
a first switch circuit comprising a first control transistor in parallel with a first plurality of series coupled transistors and having a switch input;
a second switch circuit comprising a second control transistor in parallel with a second plurality of series coupled transistors, the second switch circuit coupled in series to the first switch circuit and having a switch output;
a third plurality of series coupled transistors and a fourth plurality of series coupled transistors coupled to the switch input; and
a third control transistor coupled in series with the third plurality of series coupled transistors and coupled to a control gate of the first control transistor;

a fourth control transistor coupled in series with the fourth plurality of series coupled transistors and coupled to control gates of the first plurality of series coupled transistors;

a fifth plurality of series coupled transistors and a sixth plurality of series coupled transistors coupled to the switch output a fifth control transistor coupled in series with the fifth plurality of series coupled transistors and coupled to a control gate of the second control transistor; and a sixth control transistor coupled in series with the sixth plurality of series coupled transistors and coupled to control gates of the second plurality of series coupled transistors.

19. The memory device of claim 18, further comprising a first invertor coupled to control gates of the third and fifth control transistors; and a second invertor coupled to control gates of the fourth and sixth control transistors.

20. The memory device of claim 19, wherein an output of the first invertor is coupled to the third and fifth control transistors and to an input of the second invertor, and wherein an output of the second invertor is coupled to the fourth and sixth control transistors.

21. The memory device of claim 18, wherein third, fourth, fifth, and sixth control transistors are further respectively coupled to control gates of the fourth plurality of series coupled transistors, control gates of the third plurality of series coupled transistors, control gates of the sixth plurality of series coupled transistors, and control gates of the fifth plurality of series coupled transistors.

* * * * *